(12) United States Patent
Lee

(10) Patent No.: US 8,368,090 B2
(45) Date of Patent: Feb. 5, 2013

(54) ORGANIC LIGHT EMITTING DIODE DISPLAY DEVICE

(75) Inventor: Joong-Yong Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 131 days.

(21) Appl. No.: 12/951,468

(22) Filed: Nov. 22, 2010

(65) Prior Publication Data
US 2011/0127548 A1 Jun. 2, 2011

(30) Foreign Application Priority Data
Nov. 30, 2009 (KR) .................. 10-2009-0116420

(51) Int. Cl.
*H01L 33/00* (2010.01)
(52) U.S. Cl. .......................... 257/88; 313/243
(58) Field of Classification Search .................. 257/88, 257/E51.018; 313/243
See application file for complete search history.

(56) References Cited

U.S. PATENT DOCUMENTS

| 6,933,537 B2 * | 8/2005 | Yee et al. ............. 257/99 |
| 7,554,264 B2 * | 6/2009 | Choi et al. ............ 313/506 |

FOREIGN PATENT DOCUMENTS

| KR | 1020050048133 A | 5/2005 |
| KR | 10-2006-0058539 | 5/2006 |
| KR | 1020060041059 A | 5/2006 |
| KR | 10-0629074 | 9/2006 |
| KR | 10-0643891 | 11/2006 |
| KR | 10-2006-0134804 | 12/2006 |
| KR | 10-2007-0050767 | 5/2007 |

* cited by examiner

*Primary Examiner* — Phuc Dang
(74) *Attorney, Agent, or Firm* — Robert E. Bushnell, Esq.

(57) ABSTRACT

An organic light emitting diode (OLED) display device includes: a base substrate on which OLEDs are formed; an encapsulation substrate disposed on the base substrate to cover the OLEDs; and a bonding member connecting the base substrate and the encapsulating substrate. The base substrate and/or the encapsulation substrate include bonding grooves in which the bonding member is disposed.

19 Claims, 5 Drawing Sheets

ORGANIC LIGHT EMITTING DIODE DISPLAY DEVICE

CLAIM OF PRIORITY

This application claims the benefit accruing under 35 U.S.C. §119 from Korean Patent Application No. 10-2009-0116420, filed Nov. 30, 2009, in the Korean Intellectual Property Office, the disclosure of which is incorporated herein by reference.

BACKGROUND OF THE INVENTION

1. Field of the Invention

The present invention relates to an organic light emitting diode (OLED) display device.

2. Description of the Related Art

In general, flat panel displays (FPDs) are being used in place of cathode ray tube (CRT) displays because the FPDs are thinner and lighter. Typical examples of the FPDs include liquid crystal displays (LCDs) and organic light emitting diode (OLED) display devices. OLED display devices have a higher luminance and a wider viewing angle than LCDs. Also, OLED display devices require no backlight, and thus, may be ultrathin.

In an OLED display device, electrons emitted from a cathode recombine with holes emitted from an anode in a thin organic layer to form excitons. When the excitons transition from an excited state to a ground state, light with a specific wavelength is emitted. In order to facilitate the emission of the light by the recombination of the electrons with the holes, the anode, into which the holes are injected, may be formed of a material having a large work function, while the cathode, into which the electrons are injected, may be formed of a material having a small work function.

However, since the cathode may be highly active and chemically unstable, the cathode may react easily with external oxygen or moisture, and thus may be susceptible to oxidation or corrosion. Also, the thin organic layer may be crystallized due to a reaction with external moisture or oxygen so that the organic layer may be structurally changed and have degraded emission characteristics.

Thus, various methods for encapsulating OLED display devices have been developed in order to block oxygen and moisture from infiltrating OLED display devices. Among these, an encapsulation method using an encapsulation substrate has lately attracted considerable attention.

According to the encapsulation method using the encapsulation substrate, a bonding member may be interposed between a base substrate, on which OLEDs are formed, and the encapsulation substrate, and pressure may be applied to bond the base substrate to the encapsulation substrate.

However, since the base substrate is pressure bonded to the encapsulation substrate, the bonding member may flow out of a bonding region according to the amount and pressure applied to the bonding member. As such, controlling the width of the bonding member becomes problematic. In addition, when an amount of pressure is controlled to prevent the bonding member from flowing out, the thickness of the bonding member may be increased or become non-uniform.

SUMMARY OF THE INVENTION

The present invention provides an organic light emitting diode (OLED) display device, including a bonding member interposed between a base substrate and an encapsulation substrate, having a reduced width and thickness.

According to the present invention, an OLED display device includes a base substrate on which OLEDs are formed. An encapsulation substrate is disposed on the base substrate to cover the OLEDs, and is bonded to the base substrate using a bonding member. The base substrate or the encapsulation substrate may include a plurality of bonding grooves in which the bonding member is disposed.

According to the present invention, the bonding grooves may be disposed in edges of the base substrate or the encapsulation substrate.

According to the present invention, the bonding grooves may be disposed in a surface facing the base substrate or the encapsulation substrate.

According to the present invention, the bonding grooves may have the same width and depth or different widths and depths.

According to the present invention, at least one of the bonding grooves may form a closed loop, extending along edges of the base substrate or the encapsulation substrate.

According to the present invention, the bonding member may include a sealant or a glass frit.

According to the present invention, the encapsulation substrate may be formed of a plate-shaped glass material.

According to the present invention, an OLED display device is provided that includes a base substrate, on which a plurality of OLEDs are formed. An encapsulation substrate is disposed over the base substrate to cover the OLEDs, and is bonded to the base substrate using a bonding member. Each of the base substrate and the encapsulation substrate may include a plurality of bonding grooves, in which the bonding member is disposed.

According to the present invention, the bonding grooves may be disposed in edges of the base substrate and the encapsulation substrate.

According to the present invention, the bonding grooves may be disposed in surfaces of the base substrate and the encapsulation substrate, which are disposed opposite each other.

According to the present invention, the bonding grooves included in the base substrate may be disposed in positions vertically corresponding to the bonding grooves included in the encapsulation substrate.

According to the present invention, the bonding grooves included in the base substrate may be disposed in positions that vertically alternate with positions of the bonding grooves included in the encapsulation substrate.

According to the present invention, the bonding member may include a sealant or a glass frit.

According to the present invention, the bonding grooves included in the base substrate and the encapsulation substrate may be symmetrical with respect to one another.

According to the present invention, the bonding grooves included in each of the base substrate and the encapsulation substrate may have the same width and depth, or different widths and depths.

According to the present invention, at least one of the bonding grooves may form a closed loop along edges of the base substrate or the encapsulation substrate.

According to the present invention, the encapsulation substrate may be formed of a plate-shaped glass material.

Additional features and/or advantages of the present invention will be set forth in part in the description which follows and, in part, will be obvious from the description, or may be learned by practice of the disclosed invention.

BRIEF DESCRIPTION OF THE DRAWINGS

These and/or other aspects and advantages of the present disclosure will become apparent and more readily appreciated from the following description of the exemplary embodiments, taken in conjunction with the accompanying drawings, of which.

DETAILED DESCRIPTION OF THE INVENTION

Figure 1:
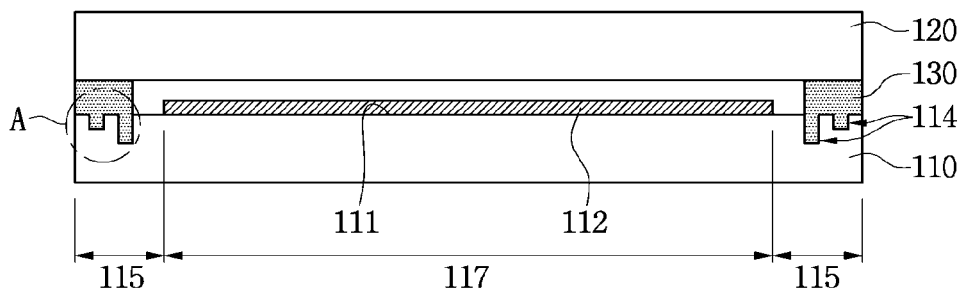
FIG. 1 is a cross-sectional view of an organic light emitting diode (OLED) display device according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the present disclosure by referring to the figures.

Figure 2:
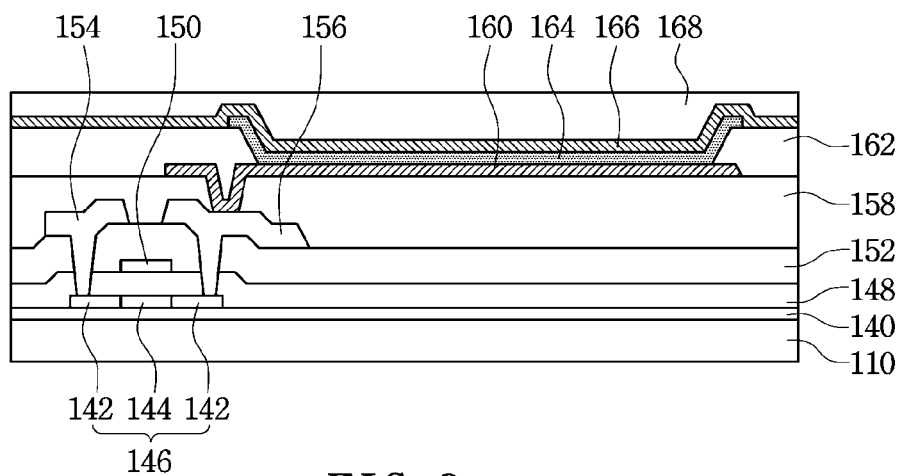
FIG. 2 is a cross-sectional view of a unit OLED according to an exemplary embodiment of the present invention.
Figure 3:
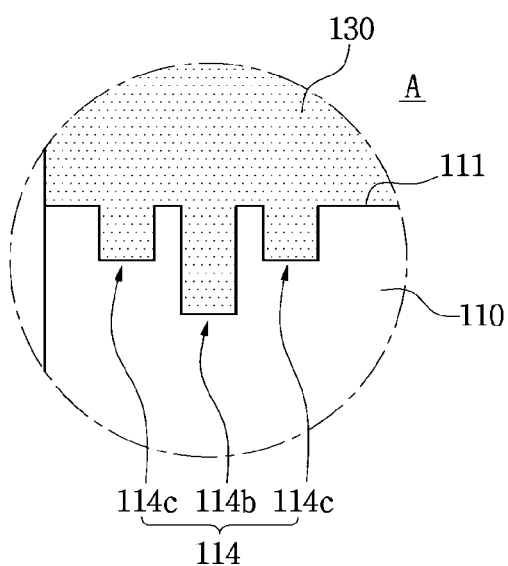
FIG. 3 is a cross-sectional view of portion "A" of FIG. 1.
Figure 4:
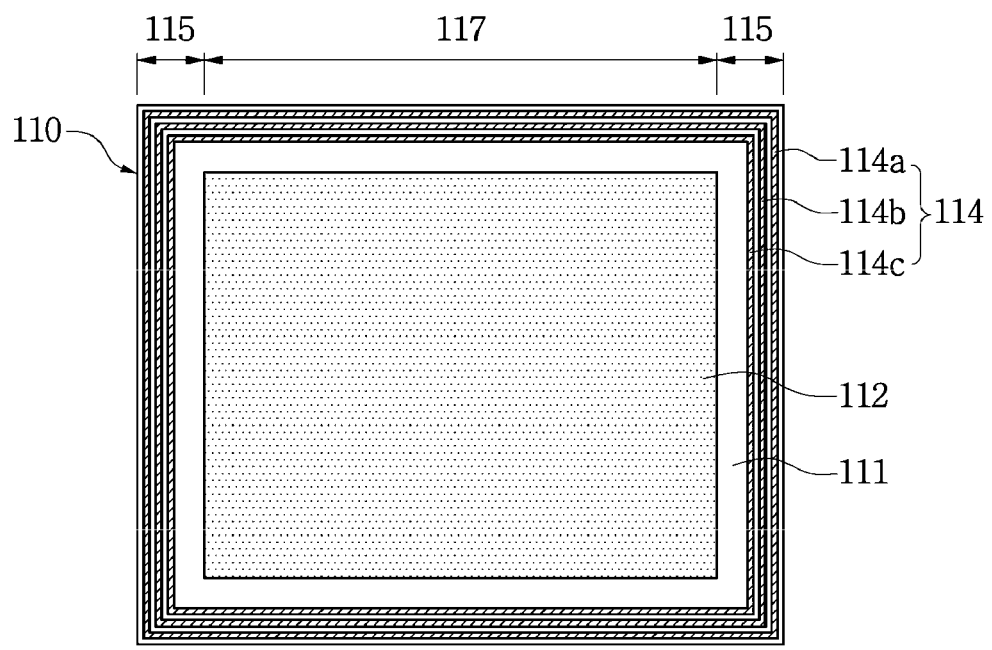
FIG. 4 is a plan view of a base substrate of the OLED display device of FIG. 1.

FIG. 1 is a cross-sectional view of an organic light emitting diode (OLED) display device according to an exemplary embodiment of the present invention, and FIG. 2 is a cross-sectional view of a unit OLED according to an exemplary embodiment of the present invention. FIG. 3 is a cross-sectional view of portion "A" of FIG. 1, and FIG. 4 is a plan view of a base substrate of the OLED display device.

Referring to FIG. 1, the OLED display device 100 includes a base substrate 110 and an encapsulation substrate 120. The base substrate 110 may include a plurality of first bonding grooves 114, and the encapsulation substrate 120 may be disposed on the base substrate 110.

Specifically, the base substrate 110 may include a pixel region 117 and a bonding region 115 disposed around the pixel region 117. The pixel region 117 may include a plurality of OLEDs, and the bonding region 115 may have the first bonding grooves 114.

The OLED display device 100 may be a top-emitting or bottom-emitting OLED display device. The present exemplary embodiment will be described using a top-emitting OLED display device of FIG. 2 for convenience.

Referring to FIG. 2, a buffer layer 140 may be disposed on the base substrate 110, and a semiconductor layer 146, having source and drain regions 142 and a channel region 144, may be disposed on the buffer layer 140. A gate insulating layer 148 covering the semiconductor layer 146 may be disposed on the base substrate 110, and a gate 150 may be disposed on the gate insulating layer 148. An interlayer insulating layer 152 covering the gate 150 may be disposed on the gate insulating layer 148. Source and drain electrodes 154 and 156, respectively, may be disposed on the interlayer insulating layer 152 and respectively connected to the corresponding source and drain regions 142. A planarization layer 158 covering the source and drain electrodes 154 and 156, respectively, may be disposed on the interlayer insulating layer 152. The planarization layer 158 may have a stacked structure of an inorganic layer and an organic layer.

A first electrode 160 may be disposed on the planarization layer 158. The first electrode 160 may be connected to the drain electrode 156 and operate as an anode. A pixel defining layer 162 exposing a portion of the first electrode 160 may be disposed on the planarization layer 158. An organic thin layer 164 may be disposed on the exposed portion of the first electrode 160 and a portion of the pixel defining layer 162. A second electrode 166 operates as a cathode and may be disposed on the pixel defining layer 162 and the organic thin layer 164. A passivation layer 168 may be disposed on the second electrode 166. The passivation layer 168, which is formed of a transparent material, may block external moisture and oxygen.

Referring to FIG. 3 and FIG. 4, which show a top surface 111 of the base substrate 110 of FIG. 1, the bonding region 115 of the base substrate 110 may be disposed at edges of the base substrate 110 surrounding the pixel region 117.

First bonding grooves 114a, 114b, and 114c may be disposed in the top surface 111 of the base substrate 110, in the bonding region 115, and facing the encapsulation substrate 120. During the bonding of the base substrate 110 and the encapsulation substrate 120, the first bonding grooves 114a, 114b, and 114c may be filled with a portion of the bonding member 130 to prevent the bonding member 130 from flowing out of the bonding region 115.

Various numbers of the first bonding grooves 114a, 114b, and 114c may be provided in consideration of, for example, the coated amount of and bonding pressure applied to the bonding member 130, and the shapes of the base and encapsulation substrates 110 and 120. The first bonding grooves 114a, 114b, and 114c may have the same or different widths and depths. For example, the first bonding grooves 114a, 114b, and 114c may have the same width and different depths or different widths and the same depth. The first bonding grooves 114a, 114b, and 114c may be spaced apart from one another by the same interval or at different intervals.

At least one of the first bonding grooves 114a, 114b, and 114c may be formed as a closed loop extending along the edge of the base substrate 110. All of the first bonding grooves 114a, 114b, and 114c may be formed as closed loops extending along the edges of the base substrate 110. When at least one of the first bonding grooves 114a, 114b, and 114c is a closed loop, the other of the first bonding grooves may be closed loops disposed inside or outside thereof.

Referring to FIGS. 1 and 3, the encapsulation substrate 120 may be disposed on the base substrate 110. The encapsulation substrate 120 may protect the pixel region 117 and OLEDs disposed therein, and may prevent external moisture and oxygen from contacting the OLEDs. The encapsulation substrate 120 may be formed of, for example, a plate-shaped glass material.

The base substrate 110 and the encapsulation substrate 120 may be bonded to each other with the bonding member 130, which is interposed between the bonding region 115 and a portion of the encapsulation substrate 120 facing the bonding region 115. The bonding member 130 may include, for example, a sealant or a glass frit, and a paste obtained by mixing a ceramic material, such as silicon dioxide, with an organic binder.

The bonding of the base substrate 110 and the encapsulation substrate 120 may include coating the bonding member 130, applying pressure to adhere the base substrate 110 and the encapsulation substrate 120, and curing the bonding member 130. In this case, during the application of the pressure, the first bonding grooves 114a, 114b, and 114c may prevent the bonding member 130 from flowing out of the bonding region 115, due to the pressure. In other words, a portion of the bonding member 130 may flow into the first bonding grooves 114a, 114b, and 114c during the bonding process, thereby preventing the bonding member 130 from flowing out of the bonding region 115.

Thus, the width of the bonding member 130 may be easily controlled. Also, since the first bonding grooves 114a, 114b, and 114c are filled with an excess amount of the bonding member 130, the base substrate 110 and the encapsulation substrate 120 may be bonded to each other under a high pressure. Therefore, the distance between the base substrate 110 and the encapsulation substrate 120 may be reduced, and the bonding member 130 may be formed to a uniform thickness.

Figure 5:
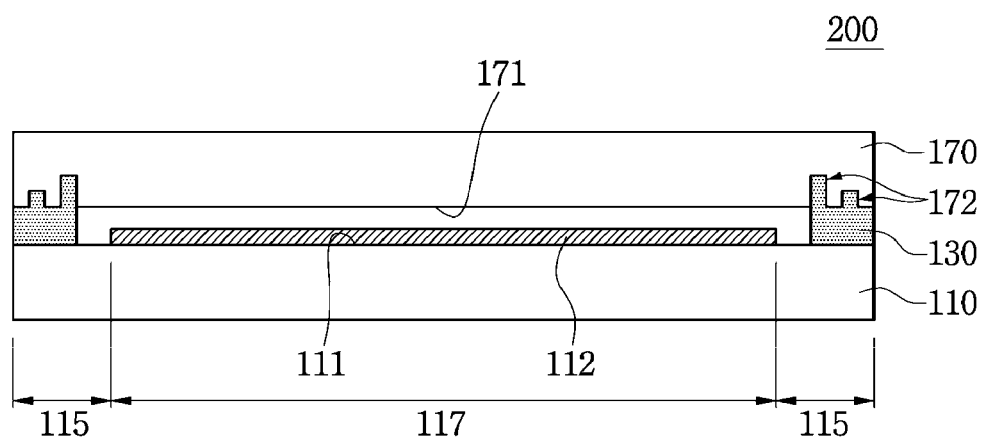
FIG. 5 is a cross-sectional view of an OLED display device according to another exemplary embodiment of the present invention.

FIG. 5 is a cross-sectional view of an OLED display device according to another exemplary embodiment of the present invention. The OLED display device 200 may include substantially the same components as the OLED display device 100. Thus, a repeated description of similar components will be omitted.

Referring to FIG. 5, the OLED display device 200 includes a base substrate 110 and an encapsulation substrate 170 disposed on the base substrate 110. The encapsulation substrate 170 includes a plurality of second bonding grooves 172.

The second bonding grooves 172 may be disposed at edges of the encapsulation substrate 170, and facing a bonding region 115 of the base substrate 110. The second bonding grooves 172 may be disposed on an inner surface 171 of the encapsulation substrate 170, which faces the base substrate 110.

Various numbers of the second bonding grooves 172 may be provided. For example, the second bonding grooves 172 can include second bonding grooves 172a, 172b, and 172c in consideration of the coated amount and bonding pressure of a bonding member, and the shapes of the base substrate 110 and the encapsulation substrate 170. The second bonding grooves 172a, 172b, and 172c may have the same width and depth or different widths and depths. The second bonding grooves 172a, 172b, and 172c may be spaced apart by the same interval or by different intervals.

At least one of the second bonding grooves 172a, 172b, and 172c may be formed as a closed loop, along the edges of the encapsulation substrate 170. For example, all of the second bonding grooves 172a, 172b, and 172c may be formed as closed loops along the edges of the base substrate 110. When at least one of the second bonding grooves 172a, 172b, and 172c is a closed loop, the second bonding grooves disposed inside or outside thereof may be formed as separate closed loops.

Figure 6:
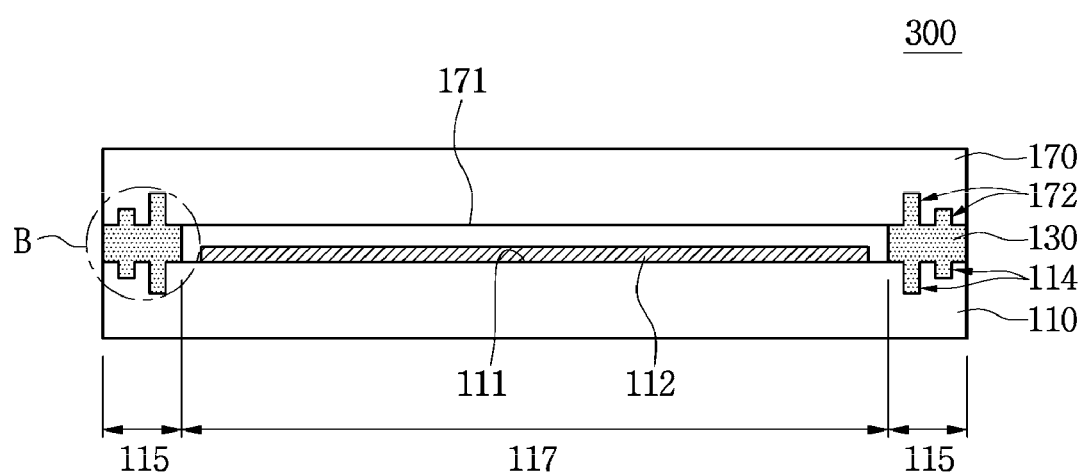
FIG. 6 is a cross-sectional view of an OLED display device according to still another exemplary embodiment of the present invention.
Figure 7A:
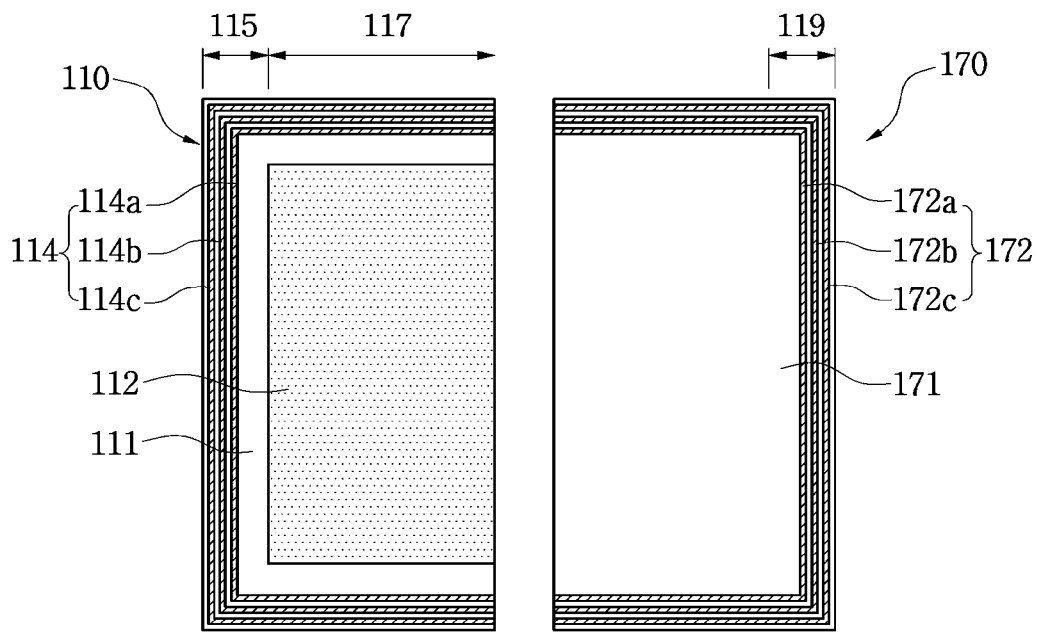
FIGS. 7A and 7B are plan views of a base substrate and an encapsulation substrate of the OLED display device of FIG. 6.
Figure 7B:
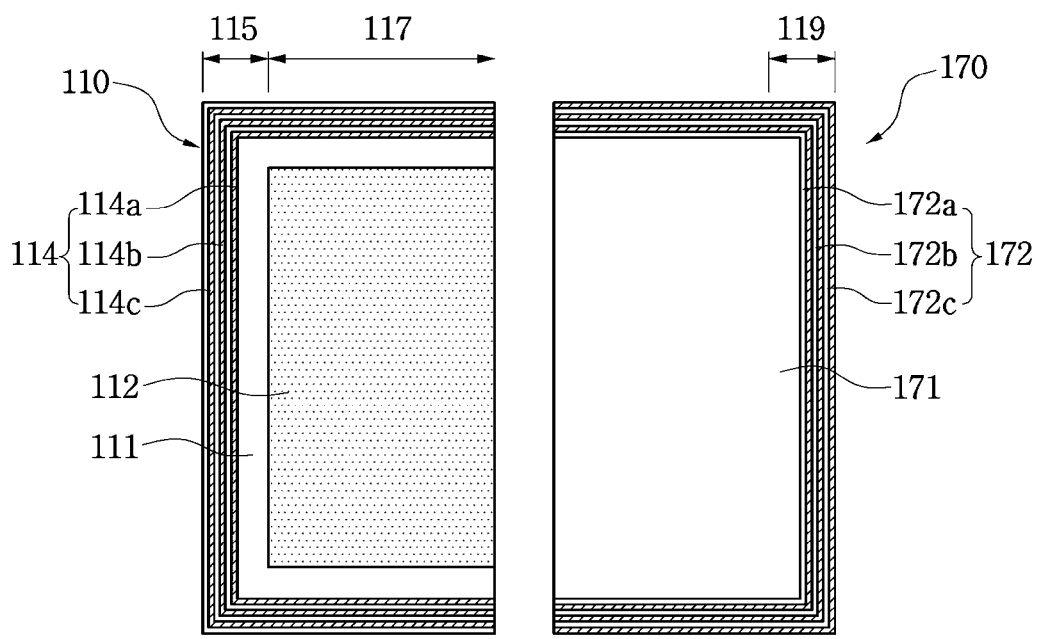
Figure 8:
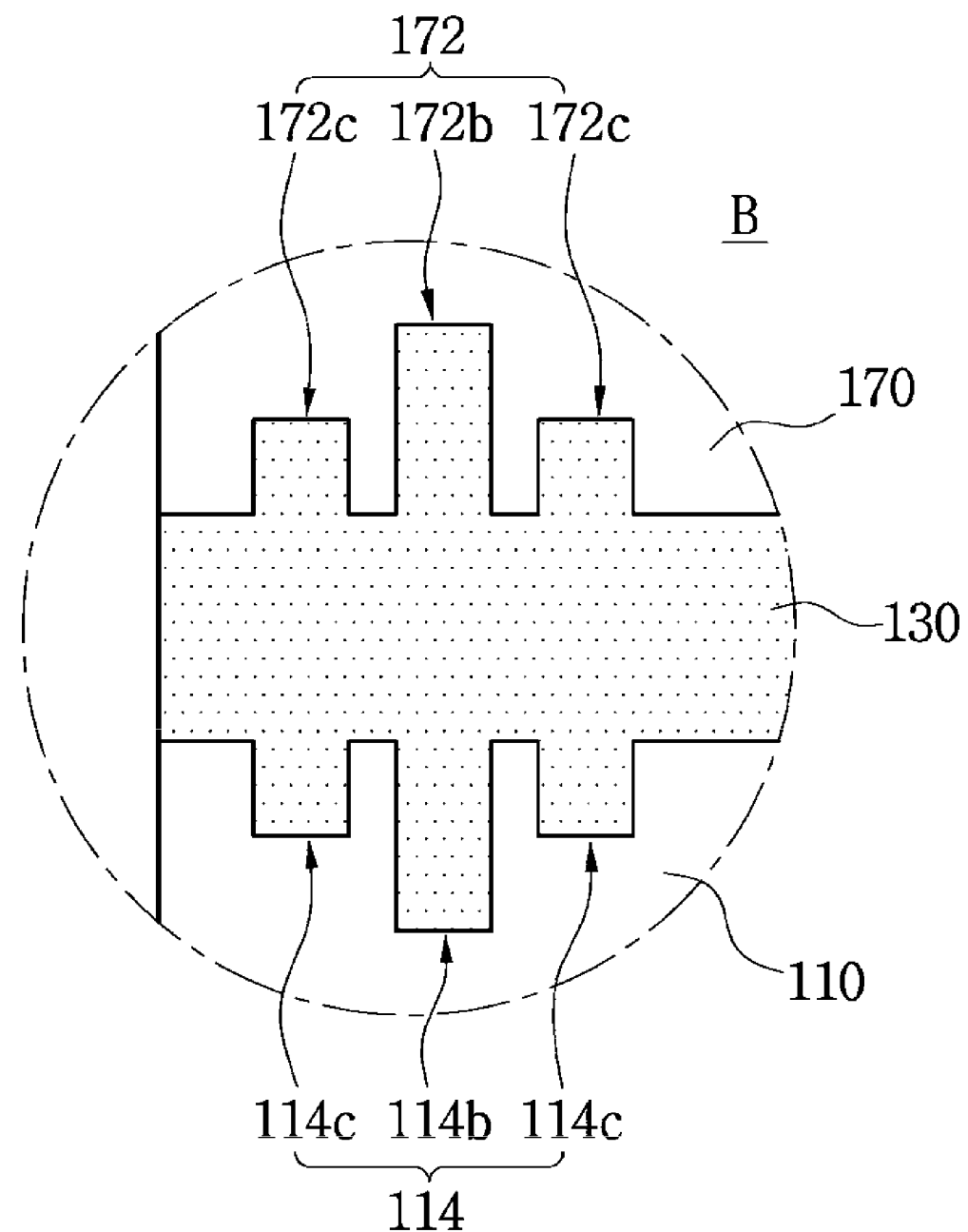
FIG. 8 is a cross-sectional view of portion "B" of FIG. 6.

FIG. 6 is a cross-sectional view of an OLED display device according to still another exemplary embodiment of the present invention, FIGS. 7A and 7B are plan views of a base substrate and an encapsulation substrate of the OLED display device of FIG. 6, and FIG. 8 is a cross-sectional view of portion "B" of FIG. 6.

The OLED display device 300 includes substantially the same components as the OLED display device 100. Thus, a repeated description of similar components will be omitted.

Referring to FIG. 6, the OLED display device 300 includes the base substrate 110 and the encapsulation substrate 170, which is disposed on the base substrate 110. The base substrate 110 may have a plurality of first bonding grooves 114, while the encapsulation substrate 170 may have a plurality of second bonding grooves 172. The base substrate 110 and the encapsulation substrate 170 may be disposed such that the first bonding grooves 114 face the second bonding grooves 172.

Specifically, referring to FIGS. 7A and 7B, which illustrate inner surfaces 111 and 171 of the base substrate 110 and the encapsulation substrate 170, respectively, the base substrate 110 may include a pixel region 117 and a first bonding region 115. The pixel region 117 may be a region where a plurality of OLEDs are formed. The encapsulation substrate 170 may include a second bonding region 119.

The first bonding region 115 may be disposed in the inner surface 111 at edges of the base substrate 110 so as to surround the pixel region 117. The first bonding grooves 114a, 114b, and 114c may be disposed in a portion of the base substrate 110 facing the first bonding region 115.

The second bonding region 119 may be disposed in the inner surface 171 at edges of the encapsulation substrate 170. The second bonding grooves 170 may include second bonding grooves 172a, 172b, and 172c disposed in a portion of the encapsulation substrate 170 facing the second bonding region 119. The second bonding region 119 may face the first bonding region 115 of the base substrate 110.

As shown in FIG. 7A, the first bonding grooves 114a, 114b, and 114c may be disposed facing the second bonding grooves 172a, 172b, and 172c. Alternatively, as shown in FIG. 7B, the first bonding grooves 114a, 114b, and 114c and the second bonding grooves 172a, 172b, and 172c may be offset from one another, i.e., so as not to directly face one another.

The first bonding grooves 114a, 114b, and 114c and the second bonding grooves 172a, 172b, and 172c may be symmetrically shaped. The first bonding grooves 114a, 114b, and 114c and the second bonding grooves 172a, 172b, and 172c may be provided in various numbers in consideration of, for example, the coated amount and bonding pressure of a bonding member, and the shapes of the base substrate 110 and the encapsulation substrate 170. The first bonding grooves 114a, 114b, and 114c and the second bonding grooves 172a, 172b, and 172c may have the same or different widths and depths. For example, the first bonding grooves 114a, 114b, and 114c and the second bonding grooves 172a, 172b, and 172c may have the same width and different depths, or different widths and the same depth. Furthermore, the first bonding grooves 114a, 114b, and 114c may be spaced apart by the same interval or by different intervals, and the second bonding grooves 172a, 172b, and 172c may be spaced apart by the same interval or by different intervals.

At least one of the first bonding grooves 114a, 114b, and 114c may be formed as a closed loop along edges of the base substrate 110. Also, at least one of the second bonding grooves 172a, 172b, and 172c may be formed as a closed loop along edges of the encapsulation substrate 110. For example, all of the first bonding grooves 114a, 114b, and 114c and the second bonding grooves 172a, 172b, and 172c may be formed as closed loops along the edges of the base substrate 110 and the encapsulation substrate 170, respectively. When at least one of the first bonding grooves 114a, 114b, and 114c and at least one of the second bonding grooves 172a, 172b, and 172c is a closed loop, the bonding grooves disposed inside or outside thereof may be separate closed loops.

The first bonding grooves 114a, 114b, and 114c may be closed loops, while the second bonding grooves 172a, 172b, and 172c may be closed loops. Alternatively, the first bonding grooves 114a, 114b, and 114c may be separate closed loops, while the second bonding grooves 172a, 172b, and 172c may be closed loops.

Referring to FIGS. 6 and 8, the base substrate 110 and the encapsulation substrate 170 may be bonded to each other by a bonding member 130 interposed between the first bonding region 115 having the first bonding grooves 114a, 114b, and 114c, and the second bonding region 119 having the second bonding grooves 172a, 172b, and 172c. The first bonding grooves 114a, 114b, and 114c and the second bonding grooves 172a, 172b, and 172c may prevent a portion of the bonding member 130 from flowing out of the first and second bonding regions 115 and 119 during the bonding process. In other words, an excess amount of the bonding member 130 may fill the first bonding grooves 114a, 114b, and 114c and the second bonding grooves 172a, 172b, and 172c during the bonding process so that the bonding member 130 does not flow out of the first and second bonding regions 115 and 119, respectively.

According to the present invention, a plurality of bonding grooves may be formed in a base substrate, on which OLEDs are formed, or in an encapsulation substrate encapsulating the base substrate. Also, a plurality of bonding grooves may be formed in each of the base substrate and the encapsulation substrate.

As a result, an excess amount of the bonding member may fill the bonding grooves during the bonding of the base substrate with the encapsulation substrate, thereby preventing the bonding member from flowing out of the bonding region. Accordingly, the width of the bonding member can be easily controlled.

Furthermore, by filing the bonding grooves with a portion of the bonding member, the base substrate and the encapsulation substrate can be bonded under a high pressure. Therefore, a distance between the base substrate and the encapsulation substrate can be reduced, and the bonding member can be formed to a uniform thickness.

As explained thus far, the present invention provides an OLED display device in which a plurality of bonding grooves are formed in a base substrate on which OLEDs are formed, or in an encapsulation substrate for encapsulating the base substrate. Also, the present invention provides an OLED display device in which bonding grooves are formed in each of a base substrate and an encapsulation substrate.

Although a few exemplary embodiments of the present invention have been shown and described, it will be appreciated by those skilled in the art that changes may be made in these exemplary embodiments without departing from the principles and spirit of the present invention, the scope of which is defined in the claims and their equivalents.

What is claimed is:

1. An organic light emitting diode (OLED) display device comprising:
    a base substrate;
    OLEDs disposed on the base substrate;
    an encapsulation substrate covering the OLEDs; and
    a bonding member connecting the base and encapsulation substrates
    wherein one of the base substrate and the encapsulation substrate includes bonding grooves in which the bonding member is disposed, and wherein depths of the bonding grooves are different from each other.

2. The display device of claim 1, wherein the bonding grooves are disposed in edge regions of said one of the base substrate and the encapsulation substrate.

3. The display device of claim 1, wherein the bonding grooves face said one of the base substrate and the encapsulation substrate.

4. The display device of claim 1, wherein the bonding grooves have a same width.

5. The display device of claim 1, wherein at least one of the bonding grooves forms a closed loop.

6. The display device of claim 1, wherein the bonding member comprises one of a sealant and a glass frit.

7. The display device of claim 1, wherein the encapsulation substrate is plate-shaped and comprises a glass material.

8. The display device of claim 1, wherein the bonding grooves have different widths.

9. An organic light emitting diode (OLED) display device comprising:
    a base substrate having first bonding grooves;
    OLEDs disposed on the base substrate; an encapsulation substrate covering the OLEDs and having second bonding grooves formed in edge regions thereof; and
    a bonding member connecting the encapsulating substrate and the base substrate, wherein the bonding member is disposed in the first and second bonding grooves,
    wherein depths of the first bonding grooves are different from each other, and depths of the second bonding grooves are different from each other.

10. The display device of claim 9, wherein the first and second bonding grooves are disposed in edge regions of the base substrate and the encapsulation substrate, respectively.

11. The display device of claim 9, wherein the first bonding grooves face the second bonding grooves.

12. The display device of claim 9, wherein each of the first bonding grooves directly faces a corresponding one of the second bonding grooves.

13. The display device of claim 9, wherein the first and second bonding grooves are offset in a direction perpendicular to a plane of the base substrates as not to directly face one another.

14. The display device of claim 9, wherein the bonding member comprises one of a sealant and a glass frit.

15. The display device of claim 9, wherein the first bonding grooves are symmetrical in shape with respect to the second bonding grooves.

16. The display device of claim 9, wherein the first and second bonding grooves have a same width.

17. The display device of claim 9, wherein at least one of the first and second bonding grooves forms a closed loop extending along edges of one of a corresponding base substrate and a corresponding encapsulation substrate.

18. The display device of claim 9, wherein the encapsulation substrate is formed of a plate-shaped glass material.

19. The display device of claim 9, wherein the first and second bonding grooves have different respective widths.

* * * * *